United States Patent [19]

Ishizuka et al.

[11] 4,292,596
[45] Sep. 29, 1981

[54] GAIN CONTROL CIRCUIT

[75] Inventors: Kohei Ishizuka, Hachiouji; Yasuhiro Kita, Hachiouji; Narimichi Maeda, Tachikawt, all of Japan

[73] Assignee: Hitachi, Ltd., Tokyo, Japan

[21] Appl. No.: 66,239

[22] Filed: Aug. 13, 1979

[30] Foreign Application Priority Data

Aug. 11, 1978 [JP] Japan .................. 53-97209

[51] Int. Cl.³ .......................................... H03G 3/00
[52] U.S. Cl. ...................................... 330/86; 330/254
[58] Field of Search ...................... 330/86, 254

[56] References Cited

U.S. PATENT DOCUMENTS 3,629,720 12/1971 Sedra et al. ................ 330/86

OTHER PUBLICATIONS

Sedra, et al. "Simple Digitally-Controlled Variable-Gain Linear D.C. Amplifier", *Electronic Eng.*, Mar. 1969 pp. 362-365.
Ottesen et al. "Digitally Controlled Amplifier Circuits", *IBM Tech. Discl. Bulletin*, vol. 16, No. 11, Apr. pp. 3504-3505 74.

*Primary Examiner*—Alfred E. Smith
*Assistant Examiner*—T. N. Grigsby
*Attorney, Agent, or Firm*—Craig and Antonelli

[57] ABSTRACT

A circuit for varying the gain of an amplifier circuit linearly in decibel by the use of a digital code signal varying linearly, wherein a resistance network to be connected between an amplifier having a fixed gain and an input or output portion for the amplification is connected and the gain of the amplifier as well as the values of resistance elements constituting the resistance network is set so that the transfer function of the amplifier circuit may become:

$$\frac{\frac{Y+1}{Y-1} + (AG + B)}{\frac{Y+1}{Y-1} - (AG + B)}$$

9 Claims, 16 Drawing Figures

("0"—OFF "1"—ON)

GAIN CONTROL CIRCUIT

BACKGROUND OF THE INVENTION

1. Field of the Invention

This invention relates to a gain control circuit, and more particularly, to a digital gain control circuit with which the gain of an amplifier can be controlled at geometric intervals by digital codes; that is, the gain in logarithmic representation can be controlled linearly in correspondence with digital codes (termed "linearly in decibel").

2. Description of the Prior Art

For example, the loss of a transmission line is given by raising the loss of a unit transmission length to the power of a transmission length. In order to compensate for this transmission loss, therefore, a circuit having characteristics inverse thereto is required. Accordingly, a circuit capable of controlling the gain of the circuit linearly in decibel becomes necessary.

As a circuit arrangement meeting such a requisite, there has heretofore been known one wherein an input side circuit or a feedback circuit of an operational amplifier is provided with a network in which a large number of series (or parallel) circuits each consisting of a switch and a resistance element are connected in parallel (or in series) and wherein any of the switches is selected by a binary code so as to obtain a predetermined gain. Since, however, the prior art circuit arrangement requires a large number of series circuits and adopts the system of once decoding a controlling digital code to convert the same into the code suitable for selecting the switch, it is unsatisfactory for the reduction of the installation cost because of a large number of circuit constituents.

SUMMARY OF THE INVENTION

The principal object of this invention is to realize a gain control circuit which varies the gain of an amplifier circuit approximately at geometric intervals, in other words, the gain in logarithmic representation linearly (linearly in decibel) by the use of digital codes. That is, the object is to realize a gain control circuit with which, when a controlling digital code signal varying linearly is applied, a switching circuit (in general, switches corresponding to the number of bits of the codes) is driven directly without decoding the code signal, and besides, the transfer function (this may be considered the gain) of a controlled circuit at the time of the drive varies linearly in decibel.

Another object of this invention is to realize a circuit arrangement which lessens the number of constituents of the gain control circuit and which is readily put into the form of an integrated circuit.

In order to accomplish the objects, this invention exploits the theory of a variable equalizer and is based on the use of an amplifier which has a fixed gain between an input and output thereof and a resistor network which has a variable resistance circuit in an input or output circuit or feedback circuit thereof connected so that the transfer function between the input and output may become:

$$\frac{\frac{Y+1}{Y-1} + (AG + B)}{\frac{Y+1}{Y-1} - (AG + B)} \tag{1}$$

(where A and B are constants),
and wherein the circuit for linearly controlling the value G is constructed of switches which are operated by bit signals constituting digital codes for control, and resistance elements.

According to such gain control circuit of this invention, a control portion of the circuit is realized in such a way that the plurality of resistance elements connected in parallel or in series and the plurality of switches connected in series or in parallel with the resistance elements are turned "on" or "off" directly by the plurality of bit signals constituting the controlling digital codes, and hence, many stages of gain can be obtained with a very small number of resistance elements and switches. Furthermore, since the gain control circuit has the transfer function as mentioned above, a gain control which is linear in decibel can be realized.

The above-mentioned and other features and objects of this invention will become more apparent by reference to the following description taken in conjunction with the accompanying drawings.

DESCRIPTION OF THE PREFERRED EMBODIMENTS

In order to cause the transfer function of a certain circuit in logarithmic representation to vary linearly in correspondence with a signal u varying linearly, the transfer function V may be expressed with respect to the variable u of the first order by:

$$V = Y^u \tag{2}$$

(Y is a constant).

Here, in case where $u = (1-x/1+x)$ is supposed in relation to:

$$V = \frac{x+Y}{xY+1} \quad (0 < x < \infty) \tag{3}$$

which is known as the transfer function V of a variable equalizer, the transfer function V is approximately expressed as:

$$V \simeq Y^u (-1 < u < 1) \tag{4}$$

Accordingly, the present invention expoits this function. From Equation (3), $$V = \frac{\frac{1-u}{1+u} + Y}{\frac{1-u}{1+u}Y + 1} = \frac{\frac{Y+1}{Y-1} + u}{\frac{Y+1}{Y-1} - u} \quad (5)$$

Here, putting $u = AG + B$ where G is linearly varied and where A and B are constants, $$V = \frac{\frac{Y+1}{Y-1} + (AG + B)}{\frac{Y+1}{Y-1} - (AG + B)} \quad (6)$$

If this transfer function can be realized, it can be exponentially varied owing to the linear variation of the value G, and accordingly, the transfer function in logarithmic representation can be linearly varied.

Figure 1A:
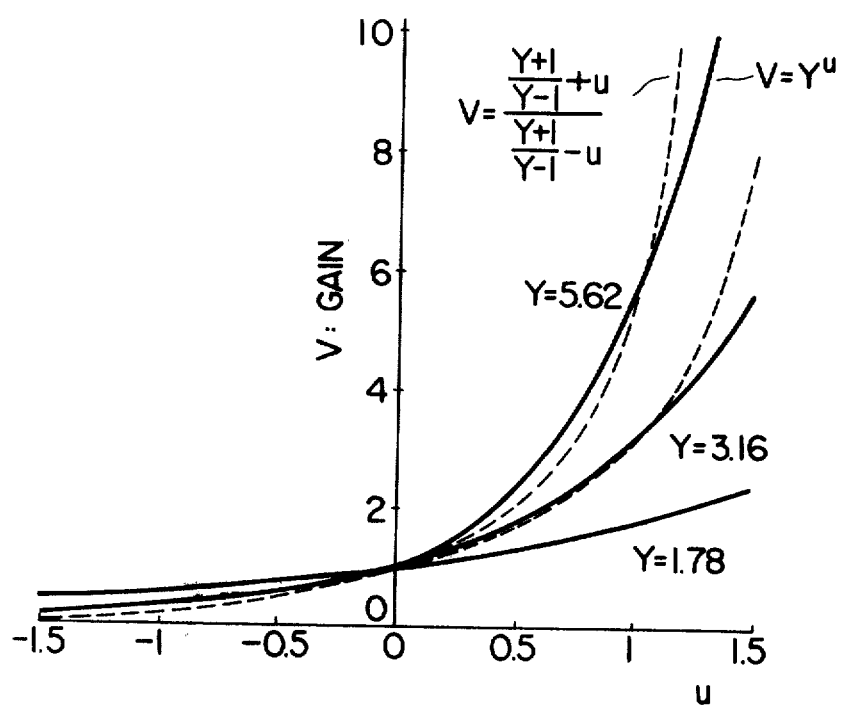
FIGS. 1A and 1B are characteristic diagrams showing the relationship between a linear variable u and a transfer function V.
Figure 1B:
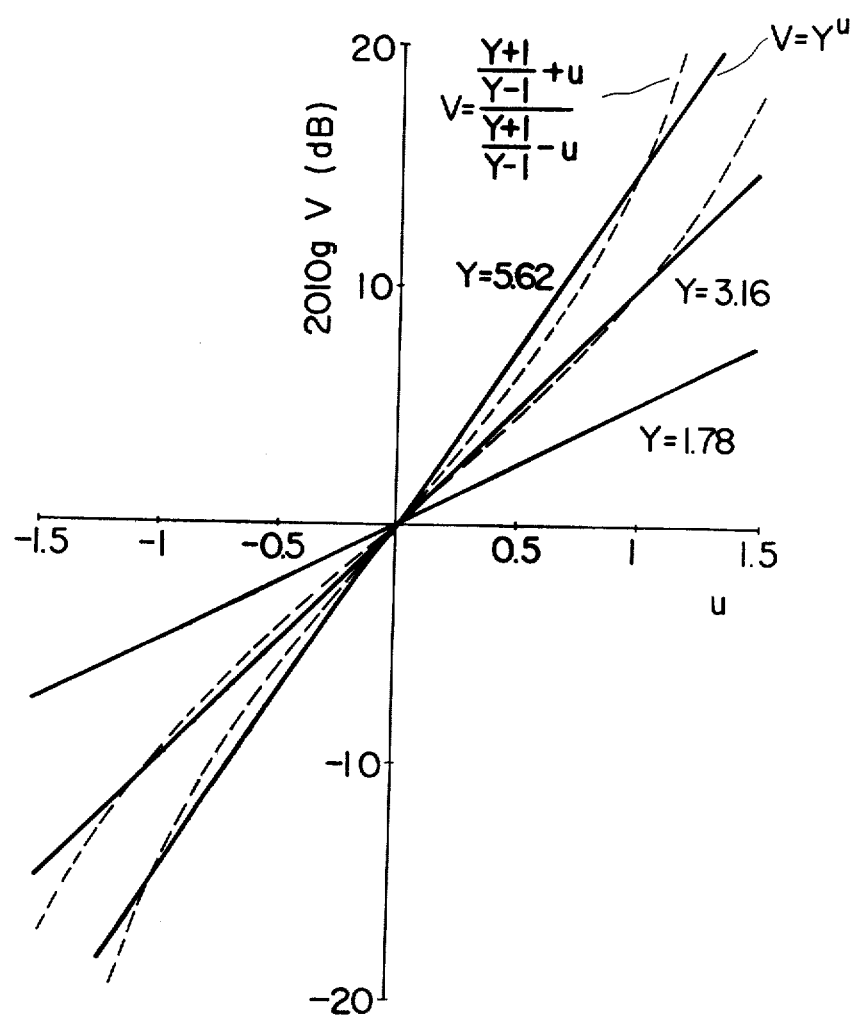

FIG. 1A illustrates the relationship among the variable u, its function $Y^u$, and the afore-cited transfer function V according to this invention. In the figure the solid line and the dotted line indicate the function $Y^u$ and the transfer function V, respectively. FIG. 1B represents in logarithm the axis of ordinates of the above relationships, and the solid line and dotted line in this figure correspond to those similar lines in FIG. 1A, respectively. Now, when u is varied from $-1$ to 1, the relation 20 log V in logarithmic representation varies linearly from $-20 \log Y$ to $20 \log Y$, as apparent from FIG. 1B. Errors from straight lines $20 \times u \log Y$ become zero at $u = -1, 0$ and $+1$, and errors in the intervening sections are negligible in a range in which Y is smaller than 1 neper.

Hereunder, this invention will be described in detail in connection with specific embodiments.

When $B=1$ and $A=-2$ are put in Equation (6), the transfer function V becomes:

$$V = \frac{\frac{Y}{Y-1} - G}{\frac{1}{Y-1} + G} = \frac{1}{\frac{1}{Y-1} + G}(Y+1) - 1 \quad (7)$$

Figure 2A:
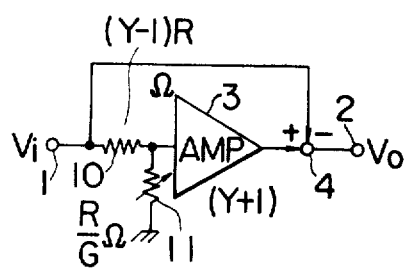
FIGS. 2A and 2B, 3A and 3B, 5, 6, and 9A and 9B are circuit diagrams each showing an embodiment of a gain control circuit according to this invention.
Figure 2B:
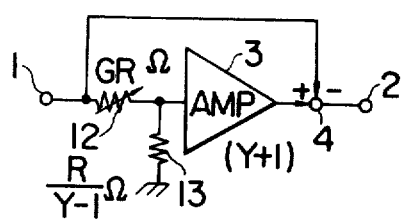

Circuits having such a transfer function can be realized by the circuit arrangements shown in FIGS. 2A and 2B.

More specifically, when $v_i$ is the voltage applied to an input terminal 1, $v_o$ an output voltage produced at a terminal 2, $(Y+1)$ the gain of an amplifier 3, and $Y-1$). R and R/G resistance values of a resistor 10 and a variable resistor 11, respectively, and when part of the input is fed forward to an adder 4 in the opposite polarity, the output $v_o$ in the case of FIG. 2A becomes:

$$v_o = v_i \frac{\frac{R}{G}}{\frac{R}{G} + (Y-1)R}(Y+1) - v_i$$

$$= v_i \left( \frac{1}{1 + (Y-1)G}(Y+1) - 1 \right)$$

In the case of FIG. 2B where a variable resistor 12 and a resistor 13 have resistance values G·R and R/(Y−1), respectively, the output $v_o$ becomes:

$$v_o = v_i \frac{\frac{R}{Y-1}}{G \cdot R + \frac{R}{Y-1}}(Y+1) - v_i$$

$$= v_i \left\{ \frac{\frac{1}{Y-1}}{G + \frac{1}{Y-1}}(Y+1) - 1 \right\}$$

Both their transfer functions $V = v_o/v_i$ are expressed by Equation (7).

When the value G is linearly varied in a range of from 0 to 1, the transfer function varies exponentially, in other words, linearly in decibel, as apparent from the foregoing description.

Figure 3A:
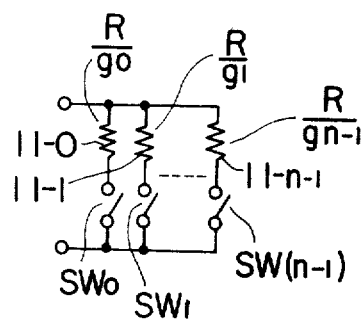

Here, the variable resistor 11 (variable resistance value R/G) in FIG. 2A is represented as $$\frac{R}{G} = \sum_{i=0}^{n-1} a_i \frac{g_i}{R_i}$$

in such a way that, as illustrated in FIG. 3A, resistance elements 11-0, 11-1 ... and 11-(n−1) of resistance values $R/g_i(i=0, 1, 2, \ldots$ and $n-1)$ are connected in parallel, switches SW0, SW1, SW2, ... and SW (n−1) being disposed in series with the respective resistance elements. Here, the coefficient $a_i$ becomes 0 or 1 in dependence upon whether the switch SWi (i=0, 1, 2, ... and n−1) is "off" or "on." Now, in the case where the respective resistance values are set at:

$$\frac{R}{g_i} = \frac{2^n - 1}{2^{n-1-i}} R$$

and where the switches SW0, SW1, ... and SW(n−1) are directly turned "on" and "off" by codes of binary n bits, G/R or G varies linearly versus the linear variation of the n-bit codes, and the transfer function of the circuit in FIG. 2A can vary approximately linearly in decibel in steps of $2^n$ in the variable range.

Figure 3B:
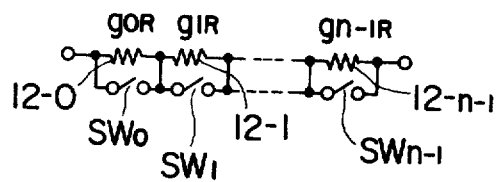

Likewise, with the circuit arrangement of FIG. 2B, the variable resistor 13 (resistance value GR) may be realized in such a way that, as shown in FIG. 3B, parallel circuits each consisting of a resistance element 12-i (resistance value $g_i$R) and a switch SWi are connected in series. That is, the resistance values are set as:

$$G \cdot R = \sum_{i=0}^{n-1} a_i g_i R (a_i = 0 \text{ or } 1)$$

$$g_i \cdot R = \frac{2^{n-1-i}}{2^n - 1} R$$

Figure 4:
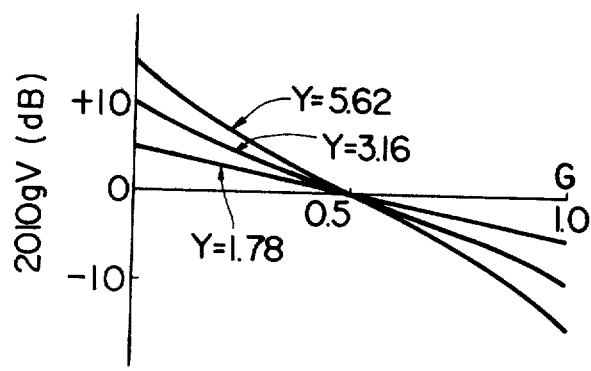
FIG. 4 is a diagram illustrating transfer functions of the gain control circuits of the embodiments shown in FIGS. 2A and 2B.

Shown in FIG. 4 are the relationships between G and the logarithmic characteristics of the transfer function at the time when, in the circuit arrangement of FIG. 2A, $Y=5.62$, $Y=3.16$ and $Y=1.78$ G is varied from 0 to 1. It is understood from FIG. 4 that the decibel variation of the transfer function is varied approximately linearly by the linear variation of G.

Figure 5:
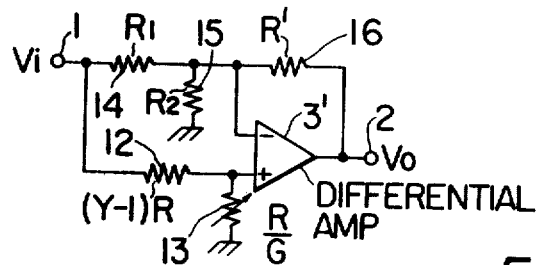

FIG. 5 is a circuit diagram of another embodiment which employs a differential amplifier as the amplifier 3.

The transfer function V according to Equation (7) varies from Y to 1/Y with the center at a gain 1. When it is endowed with a base gain or reference characteristics K, a transfer function V' can be expressed as:

$$V' = K \cdot V = K \cdot \frac{\frac{Y}{Y-1} - G}{\frac{1}{Y-1} + G}$$

The relations between the resistance values $R_1$ and $R_2$ of resistors 14 and 15 in the cases where the base gains K are Y, 1, 1/Y and K are listed as follows:

| Base Gain | $R_1$ | $R_2$ |
|---|---|---|
| K | $\frac{1}{K} R'$ | $\frac{1}{KY-1} R'$ |
| Y | $\frac{1}{Y} R'$ | $\frac{1}{Y^2-1} R$ |
| 1 | $R'$ | $\frac{1}{Y-1} R'$ |
| $\frac{1}{Y}$ | $Y R'$ | $\infty$ |

Figure 6:
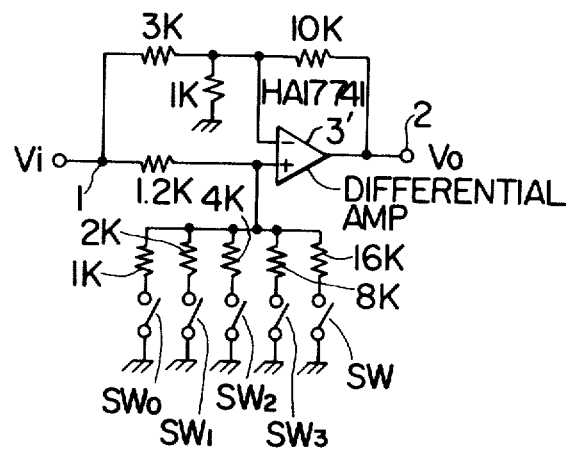

FIG. 6 shows a concrete example of the design of a circuit which can vary the gain in a control range 0–20 dB in steps of $2^5$ in a circuit such as shown in FIG. 5.

The base gain K = Y in the table of the embodiment of FIG. 5 is used. The maximum gain is expressed by 20 log K Y, and in order for it to satisfy 20 dB, $$K = Y \approx 10/3$$

Assuming that the resistance value of a resistor 16 is $R' = 10K \Omega$, $$R_1 = \frac{1}{Y} R' = \frac{3}{10} \cdot 10 = 3 \, [K\Omega]$$

$$R_2 = \frac{1}{Y^2 - 1} R' = \frac{10}{\left(\frac{10}{3}\right)^2 - 1} = \frac{90}{100 - 9} \approx 1 \, [K\Omega]$$

Because of the variation in the steps of $2^5$, n = 5, and $$\frac{g_i}{R} = \frac{2^{4-i}}{2^5 - 1} \cdot \frac{1}{R}$$

Therefore, when $R = (16/31)[K\Omega]$, the respective resistance values constituting R/G become as follows:

$$\frac{R}{g_i} = \frac{31}{2^{4-1}} \cdot \frac{16}{31} = \frac{16}{2^{4-i}} \, [K\Omega] \, (i = 0 - 4)$$

and $$(Y - 1) R = \left(\frac{10}{3} - 1\right) \cdot \frac{16}{31} = 1.2 \, [K\Omega]$$

Figure 7:
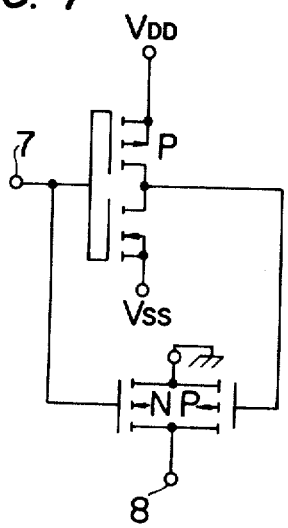
FIG. 7 shows a switch circuit which is used in the embodiment of FIG. 6.

As the switching circuit in FIG. 6 has heretofore been well known, the detailed explanation thereof is omitted herein, but an example thereof is illustrated in FIG. 7. This switching circuit is constructed of C-MOS FETs (RCA CD 4016). A code signal for control is applied to a terminal 7. $V_{DD}$ and $V_{SS}$ designate power sources, and a terminal 8 is connected to a resistance element which forms a variable resistor.

Figure 8:
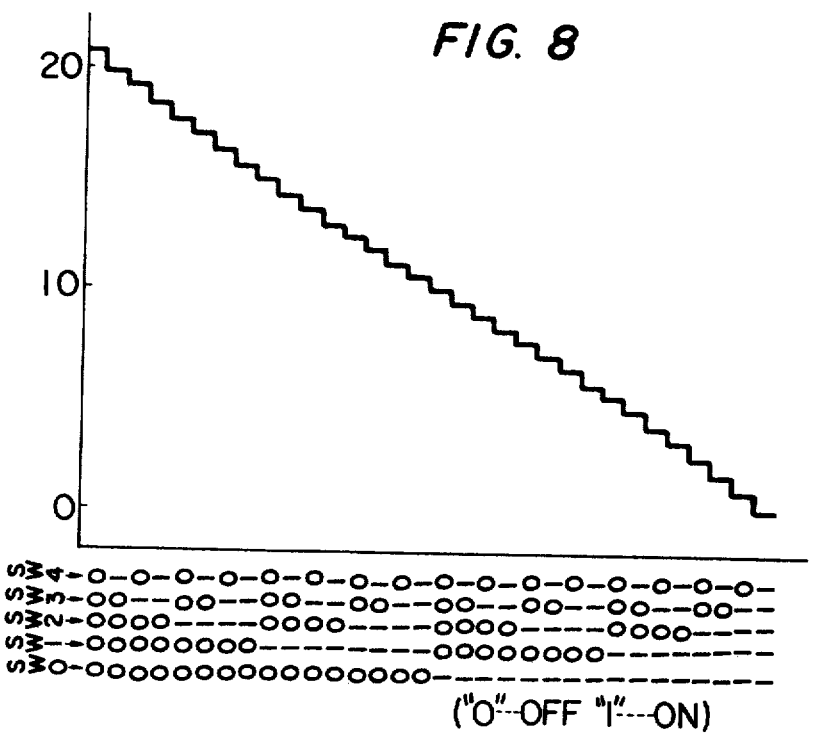
FIG. 8 illustrates actually-measured values of the relationship between control signals and gains in the gain control circuit of FIG. 6, and FIGS. 10A to 10C are circuit diagrams each serving to compare a prior art circuit and a circuit embodying this invention.

FIG. 8 shows experimental results of code signals applied to the switches SW0–SW4 and values of the transfer function (decibel representation of the gain) at the time when, in the circuit of FIG. 6, a commercially-available circuit (HA 17741) was used as the differential amplifier and when the measurement frequency was made 1 KHz.

Figure 9A:
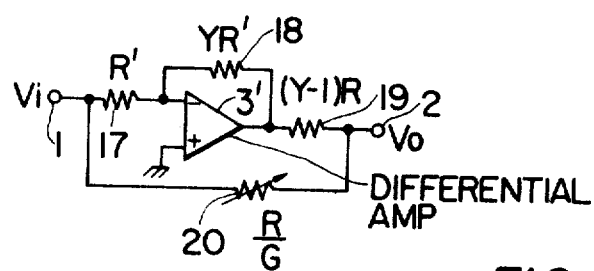
Figure 9B:
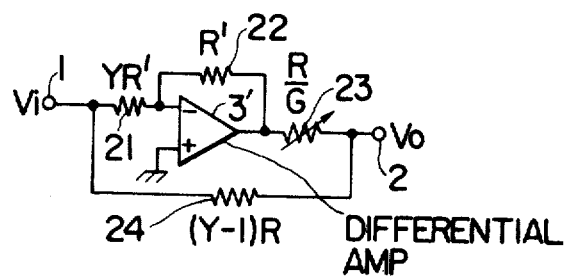

FIGS. 9A and 9B are circuit diagrams which show other embodiments in the cases of base gains K = 1 and K = 1/Y, respectively. Both are constructed in combination with differential amplifiers 3'.

In the gain control circuit of FIG. 9A, a resistance element 17 (resistance value R') is connected between an input terminal 1 and the minus terminal of the differential amplifier, a resistance element 18 (resistance value Y R') is connected between the minus terminal of the differential amplifier and the output terminal of the differential amplifier and the output terminal thereof, a resistance element 19 (resistance value (Y−1)R) is connected between the output terminal 2.

In the gain control circuit of FIG. 9B, a resistance element 21 (resistance value Y R') is connected between an input terminal 21 and the minus terminal of the differential amplifier, a resistance element 22 (resistance value R') is connected between the minus terminal of the differential amplifier and an output terminal thereof, a variable resistor 23 (resistance value R/G) is connected between the output terminal of the differential amplifier and an output terminal 2, and a resistance element 24 (resistance value (Y−1)R) is connected between the input terminal 1 and the output terminal 2.

The variable resistors 20 and 33 have the same construction, and they are the circuits shown in FIG. 3A or 3B. The transfer function of the gain control circuit in FIG. 9A is a case where K = 1 in Equation (10), and that of the gain control circuit in FIG. 9B is a case where K = 1/Y in Equation (10).

Figure 10A:
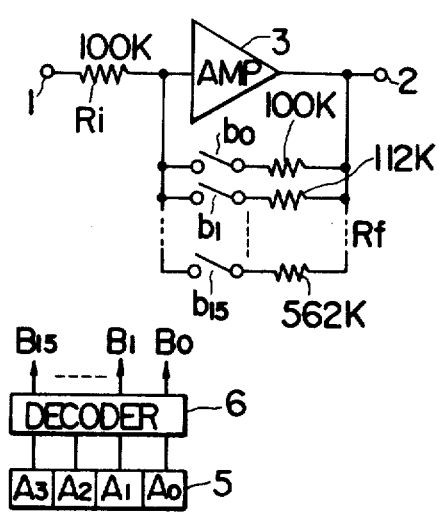
Figure 10B:
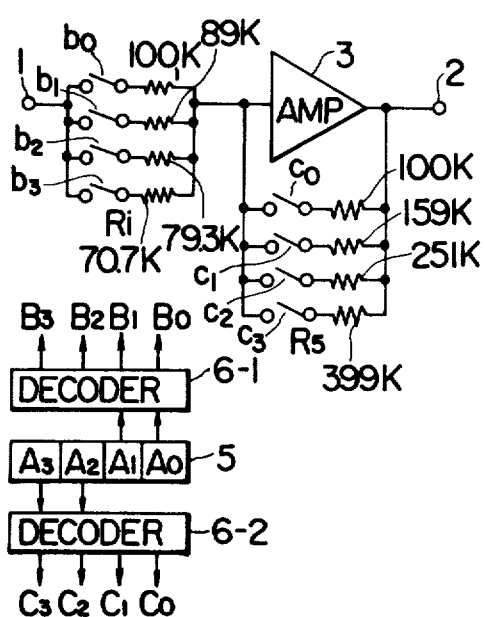
Figure 10C:
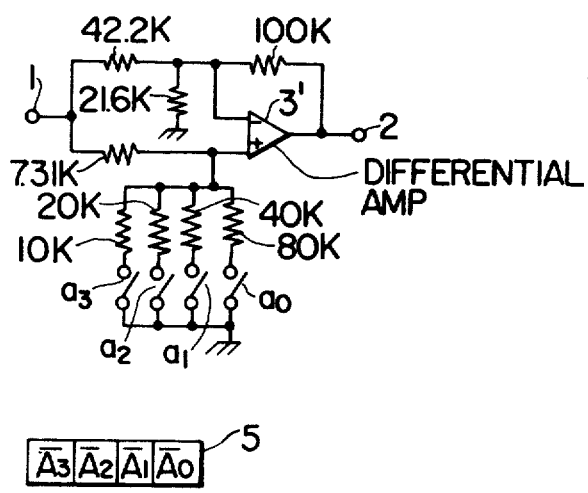

FIGS. 10A, 10B and 10C are circuit diagrams for explaining the advantages of the gain control circuit according to this invention over prior art gain control circuits of the same kinds. FIGS. 10A and 10B show the prior art gain control circuits which vary gains linearly in decibel with digital codes, while FIG. 10C shows the embodiment shown in FIG. 5. In these circuits, the gains are varied in the steps of 1 dB in a range of variable gains of 0–15 dB. In each figure numerals 1 and 2 designate an input terminal and an output terminal, respectively, and numeral 5 designates the digital code which varies linearly and which is composed of 4 bits. The prior art circuits in FIGS. 10A and 10B utilize the fact that the transfer function is represented by the ratio $R_f/R_i$ between an input resistance $R_i$ and a feedback resistance $R_f$. The circuit of FIG. 10A selects one of switches $b_0, \ldots$ and $b_{15}$. It requires seventeen (17) resistors for determining the gain, and the sixteen (16) switches $b_0, \ldots$ and $b_{15}$ in correspondence therewith. It cannot directly control the switches $b_0, \ldots$ and $b_{15}$ with the digital code $A_0 \ldots A_3$, and needs to once convert the code into a switch control signal by means of a decoder 6. On the other hand, the circuit of FIG. 10B reduces the numbers of resistance elements and switches for determining the gain. However, it still requires eight (8) switches and further requires two decoders 6-1 and 6-2. With the embodiment of this invention in FIG. 10C which affects the same gain control, the number of resistance elements for the gain control is equal to that in the prior art in FIG. 10B, but the number of switches $a_0, \ldots$ and $a_3$ is ¼ of that in the prior art circuit in FIG. 10A and ½ of that in the prior art circuit in FIG. 10B. Furthermore, the digital code $A_0 \ldots A_3$ can be directly used as a switch driving signal without requiring the decoders 6, 6-1, and 6-2.

As described above in connection with the exemplary embodiments of the invention, the gain control circuit according to this invention can control the transfer function linearly in decibel by the use of digital code varying linearly, with a comparatively simple circuit arrangement and with a single amplifier, and it can arbitrarily set the base gain. Further, the circuit form shown in FIG. 5 has very great merits in practical use because of a low output impedance.

While we have shown and described several embodiments in accordance with the present invention, it is understood that the same is not limited thereto but is susceptible of numerous changes and modifications as known to those of ordinary skill in the art and we therefore do not wish to be limited to the details shown and described herein but intend to cover all such changes and modifications as are obvious to those killed in the art.

What is claimed is:

1. A digital gain control circuit having (a) an input terminal and an output terminal; (b) an amplifier connected between said input and output terminals; and (c) a resistance network which includes a variable resistance circuit disposed between one of said terminals and said amplifier, said variable resistance circuit comprising a plurality of resistance elements and switch means including a plurality of switches for changing-over said resistance elements, said variable resistance circuit including circuit means for driving said plurality of switches directly with digital code signals, said amplifier and said resistance network being such that the transfer function between said input and output terminals is:

$$\frac{\frac{Y+1}{Y-1} + (AG + B)}{\frac{Y+1}{Y-1} - (AG + B)}$$

where Y denotes a constant which determines the gain of said amplifier and/or a value of the constituent resistance of said resistance network, G denotes a coefficient which varies in direct proportion to the digital code signal, and A and B denote constants.

2. A digital gain control circuit according to claim 1, wherein the constants $A = -2$ and $B = 1$,
said resistance network comprises means for reversing the phase of an input signal applied to said input terminal and which feeds the opposite-phase signal forwards to the output of said amplifier, a fixed resistance connected between said input terminal and an input of said amplifier and which has a resistance value of $(Y-1) R$, and a variable resistance which is connected between said input of said amplifier and ground and which has a resistance value of $R/G$.

3. A digital gain control circuit according to claim 2, wherein said variable resistance comprises a plurality of series circuits consisting of resistance elements having resistance values $(2^n - 1)/(2^{n-1-i})R(i=0, \ldots$ and $n-1)$ and switches SWi connected in parallel, and said switches SWi are controlled directly by bit signals of applied digital codes received from said circuit means.

4. A digital gain control circuit according to claim 3, wherein said amplifier is a differential amplifier, and
means for connecting a node between first and second resistances connected in series between said input terminal and ground and an end of a resistance with its other end connected to the output of said amplifier, and means for applying a voltage of said node between said first and second resistances to a minus input terminal of said differential amplifier.

5. A digital gain control circuit according to claim 1, wherein the constants $A = -2$ and $B = 1$,
said resistance network comprises means for reversing the phase of an input signal applied to said input terminal and which feeds the opposite-phase signal forwards to an output of said amplifier, a variable resistance connected between said input terminal and an input of said amplifier and which has a variable resistance value of GR (R being a fixed resistance value), and a fixed resistance which is connected between said input of said amplifier and ground and which has a fixed resistance value of $R/(Y-1)$.

6. A digital gain control circuit according to claim 5, wherein said variable resistance comprises a plurality of parallel circuits consisting of resistors having resistance values of $(2^{n-1-i})/(2^{n-1})R(i=0, \ldots$ and $n-1)$ and switches SWi $(n-1)$ connected in series, said switches SWi being controlled directly by bit signals of applied digital codes received from said circuit means.

7. A digital gain control circuit according to claim 1, wherein said resistance network comprises first, second, and third resistances connected in series between said input and output terminals, and a fourth resistance which is connected between said input and output terminals,
said third resistance has a resistance value of $(Y-1) R$,
said fourth resistance is a variable resistance which has a resistance value of $R/G$, said variable resistance being so constructed that series circuits consisting of resistance elements having resistance values of $(2^n-1)/(2^{n-1-i})R(i=0, \ldots$ and $n-1)$ and switches SWi are connected in parallel and that said switches SWi are controlled directly by bit signals of the digital codes, and
said amplifier has a potential of a node between said first and second resistances applied to a minus input terminal thereof, while an output terminal of said amplifier is connected to a node between said second and third resistors.

8. A digital gain control circuit according to claim 1, wherein said resistance network comprises first, second, and third resistances connected in series between said input and output terminals, and a resistance which is connected between said input and output terminals and which has a fixed resistance value of $(Y-1) R$,
said third resistance is a variable resistance which has a resistance value of $R/G$, said variable resistance comprising a plurality of series circuits consisting of resistance elements having resistance values of $(2^n-1)/(2^{n-1-i}) \cdot R(i=0, 1, \ldots$ and $(n-1))$ and switches SWi connected in parallel and that said switches SWi are controlled directly by bit signals of applied digital codes received from said circuit means.

9. A digital gain control circuit according to claim 8, wherein said amplifier has a potential of a node between said first and second resistances applied to a minus input terminal thereof, while the output terminal of said amplifier is connected to a node between said second and third resistances.

* * * * *